United States Patent
Huang et al.

(10) Patent No.: US 12,230,641 B2
(45) Date of Patent: Feb. 18, 2025

(54) DISPLAY PANEL, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Weiyun Huang, Beijing (CN); Jianchang Cai, Beijing (CN); Xingliang Xiao, Beijing (CN); Yao Huang, Beijing (CN); Yuanyou Qiu, Beijing (CN); Zhong Lu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 515 days.

(21) Appl. No.: 17/613,173

(22) PCT Filed: Jun. 3, 2021

(86) PCT No.: PCT/CN2021/098115
§ 371 (c)(1),
(2) Date: Nov. 22, 2021

(87) PCT Pub. No.: WO2021/249274
PCT Pub. Date: Dec. 16, 2021

(65) Prior Publication Data
US 2022/0320146 A1  Oct. 6, 2022

(30) Foreign Application Priority Data
Jun. 8, 2020 (CN) .......................... 202010511600.X

(51) Int. Cl.
*H01L 27/12* (2006.01)
*H01L 25/075* (2006.01)
(Continued)

(52) U.S. Cl.
CPC ........ *H01L 27/124* (2013.01); *H01L 27/1259* (2013.01)

(58) Field of Classification Search
CPC ... H01L 27/124; H01L 33/62; H01L 25/0753; H01L 25/167; H01L 27/156;
(Continued)

(56) References Cited

U.S. PATENT DOCUMENTS

2016/0141353 A1  5/2016  Kim et al.
2017/0205953 A1*  7/2017  Sun ..................... H01L 27/1255
(Continued)

FOREIGN PATENT DOCUMENTS

CN   110459175 A   11/2019
CN   110491918 A   11/2019
(Continued)

OTHER PUBLICATIONS

International Search Report and Written Opinion for Application No. PCT/CN2021/098115, dated Sep. 14, 2021, 8 Pages.
(Continued)

*Primary Examiner* — Sonya McCall-Shepard
(74) *Attorney, Agent, or Firm* — BROOKS KUSHMAN P.C.

(57) ABSTRACT

A display panel, a manufacturing method thereof and a display device. The display panel includes a first region and a second region. The second region includes a driving circuitry layer and a first light-emitting unit located on a base substrate, the first region includes a plurality of second light-emitting units located on the base substrate, the second light-emitting unit is electrically coupled to the driving
(Continued)

circuitry layer through a transparent conductive layer, the transparent conductive layer includes at least two conductive sub-layers laminated one on another and insulated from each other, each conductive sub-layer includes at least one transparent conductive line, and each transparent conductive line is coupled to a corresponding second light-emitting unit.

14 Claims, 3 Drawing Sheets

(51) Int. Cl.
*H01L 25/16* (2023.01)
*H01L 27/15* (2006.01)
*H01L 33/62* (2010.01)
*H10K 59/12* (2023.01)
*H10K 59/123* (2023.01)
*H10K 59/131* (2023.01)
*H10K 59/65* (2023.01)

(58) Field of Classification Search
CPC ............ H01L 27/1248; H01L 27/1259; H10K 59/131; H10K 59/65; H10K 59/123; H10K 59/8791; H10K 59/8731; H10K 59/1201; G09G 2300/0426

See application file for complete search history.

(56) References Cited

U.S. PATENT DOCUMENTS

| | | | |
|---|---|---|---|
| 2019/0393286 A1 | 12/2019 | Ding et al. | |
| 2021/0384266 A1 | 12/2021 | Zhao et al. | |
| 2021/0408200 A1 | 12/2021 | Zhao et al. | |

FOREIGN PATENT DOCUMENTS

| | | |
|---|---|---|
| CN | 110504287 A | 11/2019 |
| CN | 110890026 A | 3/2020 |
| CN | 210515985 U | 5/2020 |
| CN | 111477676 A | 7/2020 |

OTHER PUBLICATIONS

Extended European Search Report for Application No. 21802582.3-1224, dated Sep. 16, 2022, 10 Pages.
Second Office Action for European Application No. 21802582.3, dated Apr. 25, 2024, 8 Pages.

* cited by examiner

DISPLAY PANEL, MANUFACTURING METHOD THEREOF, AND DISPLAY DEVICE

CROSS-REFERENCE TO RELATED APPLICATIONS

This application is the U.S. national phase of PCT Application No. PCT/CN2021/098115 filed on Jun. 3, 2021, which claims priority to Chinese Patent Application No. 202010511600.X filed on Jun. 8, 2020, which are incorporated herein by reference in their entireties.

TECHNICAL FIELD

The present disclosure relates to the field of display technology, in particular to a display panel, a manufacturing method thereof, and a display device.

BACKGROUND

Full-screen is one of the important development trends of the display panels in recent years. For a full-screen, bezel-free display product (such as mobile phone), a screen covers an entire front surface of the display product, so as to achieve a screen-to-body ratio of approximately 100%. In this way, it is able to improve the appearance of the mobile phone and provide a sense of technology. In addition, it is able to provide the mobile phone with a larger screen, so as to significantly improve the visual experience.

SUMMARY

In one aspect, the present disclosure provides in some embodiments a display panel, including a first region and a second region. The second region includes a driving circuitry layer and a first light-emitting unit located on a base substrate, the first region includes a plurality of second light-emitting units located on the base substrate, the second light-emitting unit is electrically coupled to the driving circuitry layer through a transparent conductive layer, the transparent conductive layer includes at least two conductive sub-layers laminated one on another and insulated from each other, each conductive sub-layer includes at least one transparent conductive line, and each transparent conductive line is coupled to a corresponding second light-emitting unit.

In a possible embodiment of the present disclosure, the transparent conductive layer includes a first conductive sub-layer and a second conductive sub-layer, and the display panel further includes a source/drain electrode layer, a first insulation layer, a second insulation layer and a third insulation layer. The first insulation layer is located at a side of the source/drain electrode layer away from the base substrate, and the first insulation layer, the first conductive sub-layer, the second insulation layer, the second conductive sub-layer and the third insulation layer are laminated one on another in a direction away from the base substrate.

In a possible embodiment of the present disclosure, the first conductive sub-layer includes at least one first transparent conductive line, the second conductive sub-layer includes at least one second transparent conductive line, and an orthogonal projection of the first transparent conductive line onto the base substrate at least partially overlaps an orthogonal projection of the second transparent conductive line onto the base substrate.

In a possible embodiment of the present disclosure, the second region includes a first display region and a second display region, a resolution of the first display region is higher than a resolution of the second display region, and a driving circuitry for driving the second light-emitting unit to emit light is located in the second display region.

In a possible embodiment of the present disclosure, the second display region is located between the first display region and the first region.

In a possible embodiment of the present disclosure, the second display region is arranged around the first region.

In a possible embodiment of the present disclosure, the second display region is arranged at a horizontal edge or a longitudinal edge of the first region and the first region is adjacent to the first display region.

In a possible embodiment of the present disclosure, the driving circuitry layer includes a first driving circuitry and a second driving circuitry, the first driving circuitry is electrically coupled to the first light-emitting unit located in the second display region, and the second driving circuitry is electrically coupled to the second light-emitting unit.

In a possible embodiment of the present disclosure, a signal line corresponding to the second light-emitting unit is arranged in the first region and along the edge of the first region.

In another aspect, the present disclosure provides in some embodiments a display device, including the above-mentioned display panel.

In yet another aspect, the present disclosure provides in some embodiments a method for manufacturing a display panel. The display panel includes a first region and a second region, the second region includes a driving circuitry layer and a plurality of first light-emitting units located on a base substrate, and the first region includes a plurality of second light-emitting units located on the base substrate. The method includes forming a transparent conductive layer on the base substrate, the second light-emitting unit is electrically coupled to the driving circuitry layer through the transparent conductive layer, the transparent conductive layer includes at least two conductive sub-layers laminated one on another and insulated from each other, each conductive sub-layer includes at least one transparent conductive line, and each transparent conductive line is coupled to a corresponding second light-emitting unit.

In a possible embodiment of the present disclosure, prior to forming the transparent conductive layer on the base substrate, the method further includes: forming a source/drain electrode layer on the base substrate; and forming a first insulation layer at a side of the source/drain electrode layer away from the base substrate. The forming the transparent conductive layer on the base substrate includes forming a first conductive sub-layer, a second insulation layer, a second conductive sub-layer and a third insulation layer at a side of the first insulation layer away from the base substrate.

In a possible embodiment of the present disclosure, the method further includes forming an anode layer, a light-emitting layer and a cathode layer at a side of the third insulation layer away from the base substrate.

BRIEF DESCRIPTION OF THE DRAWINGS

In order to illustrate the technical solutions of the embodiment of the present disclosure in a clearer manner, the drawings desired for the embodiment of the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure. Based on these embodiments of the present disclosure, a person skilled in the art may, without any creative effort, obtain the other embodiments, which also fall within the scope of the present disclosure.

In the related art, a full-screen display panel is realized through providing a camera under a screen. Merely light-emitting units are reserved at a camera region of the display panel, and a driving circuitry in a same row or same column as the light-emitting units is configured to control the light-emitting units at the camera region. However, due to the restraint on a size of each pixel and a width of a wiring region, the quantity of light-emitting units to be controlled by the driving circuitry is limited, and correspondingly a size of the camera region is also limited. Hence, it is difficult to meet the requirement on the use of a large-size camera.

The present disclosure provides in some embodiments a display panel.

Figure 1:
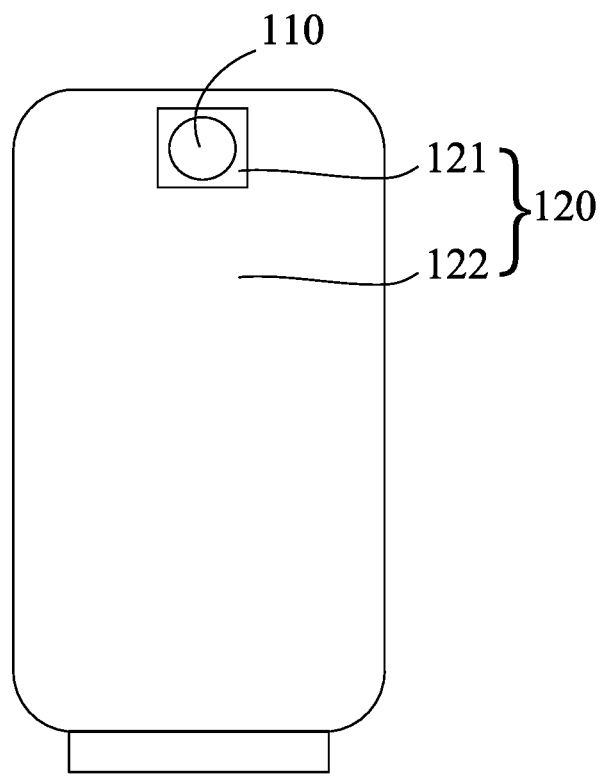
FIG. 1 is a schematic view showing a display panel according to one embodiment of the present disclosure.
Figure 2:
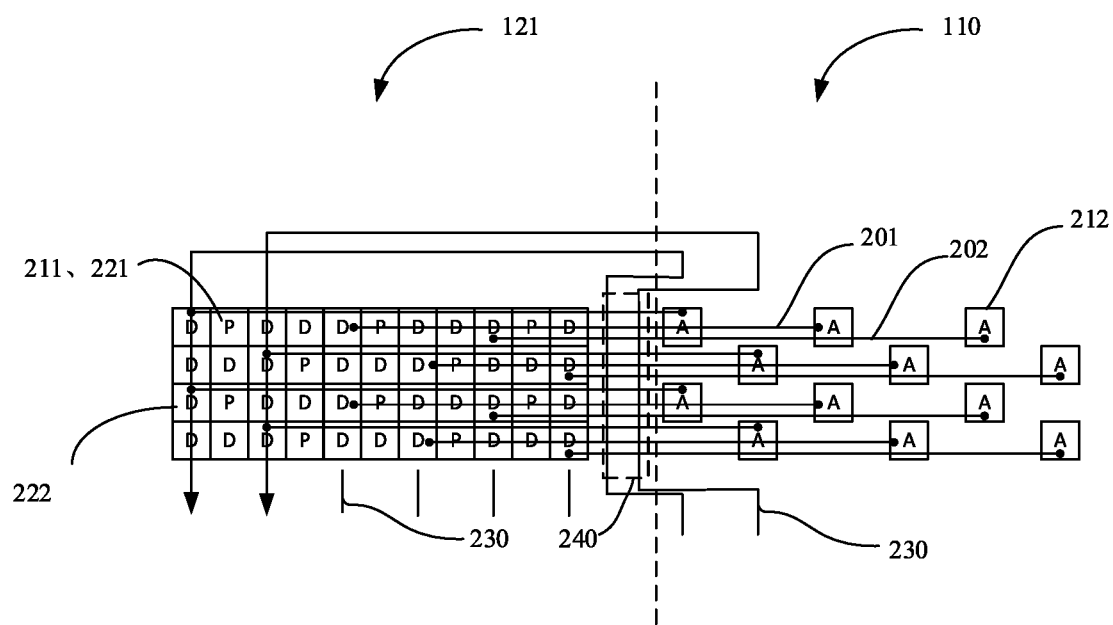
FIG. 2 is another schematic view showing the display panel according to one embodiment of the present disclosure.

As shown in FIG. 1 and FIG. 2, the display panel includes a first region 110 and a second region 120. The second region 120 includes a driving circuitry layer and a first light-emitting unit 211 located on a base substrate 400, and the first region 110 includes a plurality of second light-emitting units 212 located on the base substrate 400.

In the embodiments of the present disclosure, the first region 110 refers to a region where an under-screen camera is arranged. The driving circuitry layer is not arranged in the first region 110, and merely the light-emitting unit, that is, the second light-emitting unit 212, is reserved, so as to improve the light transmittance at the first region 110 where the under-screen camera is located and ensure a photographing effect of the under-screen camera.

The second light-emitting unit 212 is electrically coupled to the driving circuitry layer through a transparent conductive layer, the transparent conductive layer includes at least two conductive sub-layers laminated one on another and insulated from each other, each conductive sub-layer includes at least one transparent conductive line, and each transparent conductive line is coupled to a corresponding second light-emitting unit 212.

It should be appreciated that, the transparent conductive layer in the embodiments of the present disclosure is made of a transparent and conductive material, such as Indium Tin Oxide (ITO), so as to transmit an electric signal to the second light-emitting unit 212, and prevent the transparency of the first region 110 from being decreased too much to affect an imaging effect of a camera.

In this regard, in the embodiments of the present disclosure, the driving circuitry layer is electrically coupled to the light-emitting unit through the transparent conductive layer, the transparent conductive layer includes at least two conductive sub-layers laminated one on another and insulated from each other, and each conductive sub-layer includes at least one transparent conductive line.

Each transparent conductive line is provided with a certain width and each pixel is also provided with a certain longitudinal size, so the quantity of pixels in each row is also limited in the first region 110. In the embodiments of the present disclosure, the transparent conductive layer includes at least two conductive sub-layers laminated one on another and insulated from each other, and each conductive sub-layer includes at least one transparent conductive line, so it is able to provide more transparent conductive lines within a certain range in a longitudinal direction for driving more light-emitting units, thereby to enlarge the first region 110 for a large-size camera.

In a possible embodiment of the present disclosure, the transparent conductive layer includes two conductive sub-layers, i.e., a first conductive sub-layer 401 and a second conductive sub-layer 402. The display panel further includes a source/drain electrode layer 230, a first insulation layer 411, a second insulation layer 412 and a third insulation layer 413. The first insulation layer 411 is located at a side of the source/drain electrode layer 230 away from the base substrate 400, and the first insulation layer 411, the first conductive sub-layer 401, the second insulation layer 412, the second conductive sub-layer 402 and the third insulation layer 413 are laminated one on another in a direction away from the base substrate 400.

In the embodiments of the present disclosure, the first insulation layer 411 is configured to insulate the source/drain electrode layer 230 from the first conductive sub-layer 401, the second insulation layer 412 is configured to insulate the first conductive sub-layer 401 from the second conductive sub-layer 402, and the third insulation layer 413 is configured to insulate the second conductive sub-layer 402 from the electrode of the first light-emitting unit 211.

It should be appreciated that, one or more of the first insulation layer 411, the second insulation layer 412 and the third insulation layer 413 may be reused as a planarization layer after planarization.

Specifically, the third insulation layer 413 may be reused as the planarization layer. After the formation of the third insulation layer 413, the light-emitting unit is formed in such a manner that an anode of the light-emitting unit is formed on the substantially flat third insulation layer.

In a possible embodiment of the present disclosure, the first conductive sub-layer 401 includes at least one first transparent conductive line 201, and the second conductive sub-layer 402 includes at least one second transparent conductive line 202. An orthogonal projection of the first transparent conductive line 201 onto the base substrate 400 at least partially overlaps an orthogonal projection of the second transparent conductive line 202 onto the base substrate 400.

In the embodiments of the present disclosure, when the orthogonal projection of the first transparent conductive line 201 onto the base substrate 400 at least partially overlaps the orthogonal projection of the second transparent conductive line 202 onto the base substrate 400, so as to make full use of the space.

In this regard, within the same width range, the quantity of the transparent conductive lines may be at most twice that of the transparent conductive lines arranged in a single layer, and the quantity of the controlled second light-emitting units 212 is also doubled, so it is able to enlarge the first region 110.

In actual use, more transparent conductive layers, e.g., three, four or more transparent conductive layers, may be provided according to the practical need, so as to control more second light-emitting units 212.

As shown in FIG. 1, the second region 120 includes a first display region 122 and a second display region 121, and a resolution of the first display region 122 is higher than a resolution of the second display region 121. A driving circuitry for driving the second light-emitting unit 212 to emit light is located in the second display region 121.

Referring to FIG. 1 again, in the embodiments of the present disclosure, the first display region 122 is a conventional display region with a high resolution. The first display region 122 is known in the art, and thus will not be particularly defined herein.

The second display region is provided not only for achieving a conventional display function, but also for accommodating the driving circuitry. In other words, the first region 110 is only provided with the second light-emitting unit 212, and the driving circuitry for driving these light-emitting unit is located in the second display region 121.

In this regard, when the quantity of driving circuitries is constant in a unit area, the total quantity of light-emitting units driven by these driving circuitries is also constant. Some of the light-emitting units need to be arranged in the first region 110, so the resolution of the second display region 121 is lower than that of the first display region 122.

As shown in FIG. 1, in a possible embodiment of the present disclosure, the second display region 121 is located between the first display region 122 and the first region 110. For example, the second display region 121 may be arranged around the first region 110. The second display region 121 may also be arranged at a horizontal edge or a longitudinal edge of the first region 110, and the first region 110 is adjacent to the second display region 121. In this way, it is able to reduce a length of the line at the transparent conductive layer.

In some embodiments of the present disclosure, a shape of an orthogonal projection of the first region 110 onto the base substrate 400 may be circular, rectangular or irregular.

Specifically, the driving circuitry layer includes a first driving circuitry 221 and a second driving circuitry 222. The first driving circuitry 221 is electrically coupled to the first light-emitting unit 211 in the second display region 121, and the second driving circuitry 222 is electrically coupled to the second light-emitting unit 212.

The first driving circuitry 221 is configured to drive the first light-emitting unit 211 in the second display region 121, and the second driving circuitry 222 is configured to drive the second light-emitting unit 212 in the first region 110.

In FIG. 2, a region A represents a region where merely the light-emitting unit is arranged, a region D represents a region where merely the driving circuitry is arranged, and a region P represents a region where both the light-emitting unit and the driving circuitry are arranged.

In other words, the region P in the second display region 121 is used to achieve the conventional display function, and the region D in the second display region 121 is used to provide the second driving circuitry 222 for driving the second light-emitting unit 212 in the first region 110, and the second light-emitting unit 212 is located in the region A in the first region 110.

In some embodiments of the present disclosure, a signal line corresponding to the second light-emitting unit is arranged in the first region and along the edge of the first region.

In a possible embodiment of the present disclosure, the source/drain electrode layer 230 corresponding to the second light-emitting unit 212 is arranged in the first region 110 and along the edge of the first region 110.

Generally, the source/drain electrode layer 230 is made of a non-transparent material, so in the embodiments of the present disclosure, the source/drain electrode layer 230 is arranged in such a manner as to bypass the first region 110.

In the second display region 121, as shown in FIG. 2, an extension direction of the source/drain electrode layer 230 is known in the related, e.g., the source/drain electrode layer 230 is arranged along a longitudinal direction of the display panel. However, at the first region 110, the source/drain electrode layer 230 may not directly pass through the first region 110, and instead, it passes through a wiring region 240 at an the edge of the first region 110 so as to bypass the first region 110, thereby to prevent the transparency of the first region 110 from being adversely affected.

The present disclosure further provides in some embodiments a display device, which includes the above-mentioned display panel.

The implementation of the display device may refer to that of the display substrate mentioned hereinabove with a same technical effect, and thus will not be particularly defined herein.

The present disclosure further provides in some embodiments a method for manufacturing a display panel.

The display panel includes a first region and a second region. The second region includes a driving circuitry layer and a first light-emitting unit on a base substrate. The first region includes a plurality of second light-emitting units on the base substrate. The method includes forming a transparent conductive layer on the base substrate, the second light-emitting unit is electrically coupled to the driving circuitry layer through the transparent conductive layer, the transparent conductive layer includes at least two conductive sub-layers laminated one on another and insulated from each other, each conductive sub-layer includes at least one transparent conductive line, and each transparent conductive line is coupled to a corresponding second light-emitting unit.

In the embodiments of the present disclosure, the resultant display panel is specifically that mentioned hereinabove, and the involved process is known in the art. The method may be used to manufacture the above-mentioned display panel with a same technical effect, which will not be particularly defined herein.

In a possible embodiment of the present disclosure, prior to forming the transparent conductive layer on the base substrate, the method further includes: forming a source/drain electrode layer on the base substrate; and forming a first insulation layer at a side of the source/drain electrode layer away from the base substrate. The forming the transparent conductive layer on the base substrate includes forming a first conductive sub-layer, a second insulation layer, a second conductive sub-layer and a third insulation layer at a side of the first insulation layer away from the base substrate.

In the embodiments of the present disclosure, after the formation of the source/drain electrode layer 230, the first insulation layer for insulating the source/drain electrode layer 230 from the first conductive sub-layer is formed, and then the first conductive sub-layer is formed. Next, the second insulation layer for insulating the first conductive sub-layer from the second conductive sub-layer is formed, the second conductive sub-layer is formed, and then the third insulation layer is formed.

It should be appreciated that, one or more of the first insulation layer, the second insulation layer and the third insulation layer may be reused as a planarization layer after planarization. After the formation of the third insulation layer, the light-emitting unit may be formed.

Figure 3:
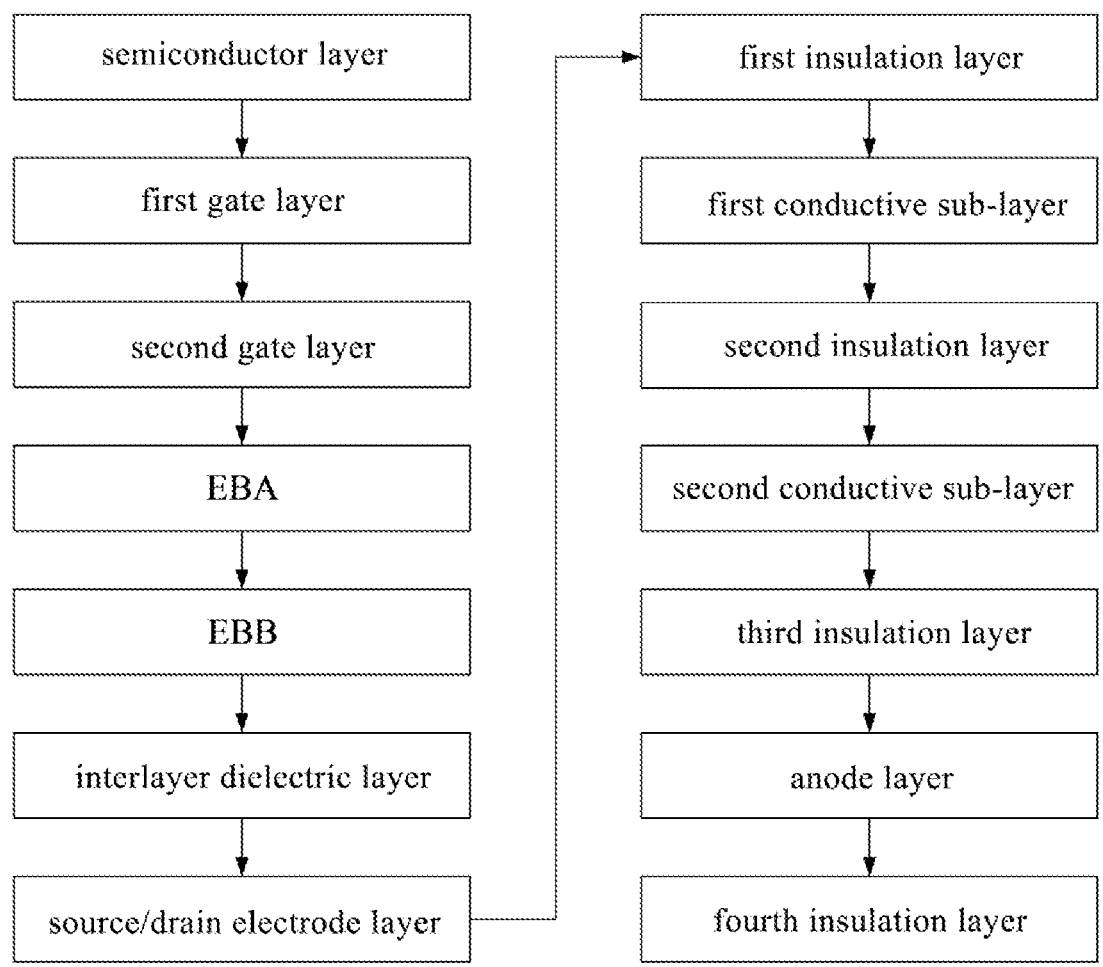
FIG. 3 is a flow chart of a method for manufacturing the display panel according to one embodiment of the present disclosure.
Figure 4:
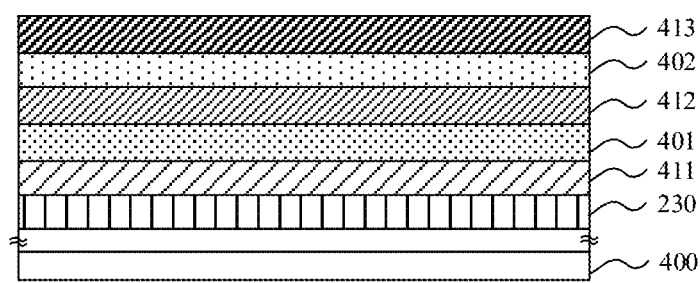
FIG. 4 is yet another schematic view showing the display panel according to one embodiment of the present disclosure.

As shown in FIG. 3, at first, the driving circuitry layer is formed. To be specific, a semiconductor layer, a first gate layer and a second gate layer are formed sequentially, and then EBA and EBB masking processes are performed. The EBA masking process is used to etch portions of a first gate insulation layer and a second gate insulation layer in a bending region, and the EBB masking process is used to etch portions of a buffer layer and an etch stop layer in the bending region.

Next, an interlayer dielectric layer and the source/drain electrode layer are formed. Further, the formation the transparent conductive layer specifically includes forming the first insulation layer, the first conductive sub-layer, the second insulation layer, the second conductive sub-layer and the third insulation layer.

Finally, the light-emitting unit is formed. To be specific, the light-emitting unit includes an anode layer, a light-emitting layer and a cathode layer laminated one on another.

It should be appreciated that, some structures, e.g., a buffer layer, a stop layer and a planarization layer, are omitted in FIG. 3. The processes involved in the steps may refer to those known in the art, and thus will not be particularly defined herein.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a first region and a second region, wherein the second region includes a driving circuitry layer and a first light-emitting unit located on a base substrate, the first region includes a plurality of second light-emitting units located on the base substrate, the second light-emitting unit is electrically coupled to the driving circuitry layer through a transparent conductive layer, the transparent conductive layer includes at least two conductive sub-layers laminated one on another and insulated from each other, each conductive sub-layer includes at least one transparent conductive line, and each transparent conductive line is coupled to a corresponding second light-emitting unit;
wherein the transparent conductive layer includes a first conductive sub-layer and a second conductive sub-layer, and the display panel further includes a source/drain electrode layer, a first insulation layer, a second insulation layer and a third insulation layer, wherein the first insulation layer is located at a side of the source/drain electrode layer away from the base substrate, and the first insulation layer, the first conductive sub-layer, the second insulation layer, the second conductive sub-layer and the third insulation layer are laminated one on another in a direction away from the base substrate; and
the second insulation layer insulates the first conductive sub-layer from the second conductive sub-layer.

2. The display panel according to claim 1, wherein the first conductive sub-layer includes at least one first transparent conductive line, the second conductive sub-layer includes at least one second transparent conductive line, and an orthogonal projection of the first transparent conductive line onto the base substrate at least partially overlaps an orthogonal projection of the second transparent conductive line onto the base substrate.

3. The display panel according to claim 1, wherein the second region includes a first display region and a second display region, a resolution of the first display region is higher than a resolution of the second display region, and a driving circuitry for driving the second light-emitting unit to emit light is located in the second display region.

4. The display panel according to claim 3, wherein the second display region is located between the first display region and the first region.

5. The display panel according to claim 4, wherein the second display region is arranged around the first region.

6. The display panel according to claim 4, wherein the second display region is arranged at a horizontal edge or a longitudinal edge of the first region and the first region is adjacent to the first display region.

7. The display panel according to claim 3, wherein the driving circuitry layer includes a first driving circuitry and a second driving circuitry, the first driving circuitry is electrically coupled to the first light-emitting unit located in the second display region, and the second driving circuitry is electrically coupled to the second light-emitting unit.

8. The display panel according to claim 1, wherein a signal line corresponding to the second light-emitting unit is arranged in the first region and along the edge of the first region.

9. A display device, comprising the display panel according to claim 1.

10. A method for manufacturing a display panel, wherein the display panel includes a first region and a second region, the second region includes a driving circuitry layer and a plurality of first light-emitting units located on a base substrate, and the first region includes a plurality of second light-emitting units located on the base substrate, wherein the method includes forming a transparent conductive layer on the base substrate, the second light-emitting unit is electrically coupled to the driving circuitry layer through the transparent conductive layer, the transparent conductive layer includes at least two conductive sub-layers laminated one on another and insulated from each other, each conductive sub-layer includes at least one transparent conductive line, and each transparent conductive line is coupled to a corresponding second light-emitting unit:
wherein prior to forming the transparent conductive layer on the base substrate, the method further includes: forming a source/drain electrode layer on the base substrate; and forming a first insulation layer at a side of the source/drain electrode layer away from the base substrate, wherein the forming the transparent conductive layer on the base substrate includes forming a first conductive sub-layer, a second insulation layer, a second conductive sub-layer and a third insulation layer at a side of the first insulation layer away from the base substrate;
the second insulation layer insulates the first conductive sub-layer from the second conductive sub-layer.

11. The method according to claim 10, further comprising forming an anode layer, a light-emitting layer and a cathode layer at a side of the third insulation layer away from the base substrate.

12. The display panel according to claim 4, wherein the driving circuitry layer includes a first driving circuitry and a second driving circuitry, the first driving circuitry is electrically coupled to the first light-emitting unit located in the second display region, and the second driving circuitry is electrically coupled to the second light-emitting unit.

13. The display panel according to claim 5, wherein the driving circuitry layer includes a first driving circuitry and a second driving circuitry, the first driving circuitry is electrically coupled to the first light-emitting unit located in the second display region, and the second driving circuitry is electrically coupled to the second light-emitting unit.

14. The display panel according to claim 6, wherein the driving circuitry layer includes a first driving circuitry and a second driving circuitry, the first driving circuitry is electrically coupled to the first light-emitting unit located in the second display region, and the second driving circuitry is electrically coupled to the second light-emitting unit.

\* \* \* \* \*